United States Patent
Stockman et al.

(10) Patent No.: US 9,698,323 B2
(45) Date of Patent: Jul. 4, 2017

(54) FRAME BASED PACKAGE FOR FLIP-CHIP LED

(71) Applicant: KONINKLIJKE PHILIPS N.V., Eindhoven (NL)

(72) Inventors: Stephen Andrew Stockman, Morgan Hill, CA (US); Marc Andre de Samber, Lommel (BE); Oleg Borisovich Shchekin, San Francisco, CA (US); Norbertus Antonius Maria Sweegers, Lierop (NL); Ashim Shatil Haque, Fremont, CA (US); Yourii Martynov, Geldrop (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/917,217

(22) PCT Filed: Aug. 28, 2014

(86) PCT No.: PCT/IB2014/064106
§ 371 (c)(1),
(2) Date: Mar. 7, 2016

(87) PCT Pub. No.: WO2015/036887
PCT Pub. Date: Mar. 19, 2015

(65) Prior Publication Data
US 2016/0240755 A1    Aug. 18, 2016

Related U.S. Application Data

(60) Provisional application No. 61/877,434, filed on Sep. 13, 2013, provisional application No. 61/936,360, filed on Feb. 6, 2014.

(51) Int. Cl.
*H01L 33/60* (2010.01)
*H01L 33/48* (2010.01)
(Continued)

(52) U.S. Cl.
CPC .......... *H01L 33/60* (2013.01); *H01L 33/0075* (2013.01); *H01L 33/486* (2013.01);
(Continued)

(58) Field of Classification Search
CPC ....... H01L 33/60; H01L 33/486; H01L 33/62; H01L 33/502; H01L 33/0075; H01L 2933/0041; H01L 2933/0033
See application file for complete search history.

(56) References Cited

U.S. PATENT DOCUMENTS

2004/0070338 A1\* 4/2004 Noguchi ............... H01L 33/486
313/512
2005/0269587 A1    12/2005 Loh et al.
(Continued)

FOREIGN PATENT DOCUMENTS

DE    102009036621 A1    2/2011
DE    102010025319 A1    12/2011
(Continued)

OTHER PUBLICATIONS

EPO as ISA, PCT/IB2014/064106, filed Aug. 8, 2014, "International Search Report and Written Opinion" dated Dec. 16, 2014, 11 pages.

*Primary Examiner* — Roy Potter
*Assistant Examiner* — Paul Patton
(74) *Attorney, Agent, or Firm* — Volpe and Koenig, P.C.

(57) ABSTRACT

A hollow frame is configured to surround the periphery of a substantially self-supporting flip-chip light emitting device. The frame may be shaped to also contain a wavelength conversion element above the light emitting surface of the light emitting device. The lower surface of the light emitting device, which is exposed through the hollow frame, includes contact pads coupled to the light emitting element for surface mounting the light emitting module on a printed
(Continued)

circuit board or other fixture. The flip-chip light emitting device may include a patterned sapphire substrate (PSS) upon which the light emitting element is grown, the patterned surface providing enhanced light extraction from the light emitting element, through the patterned sapphire substrate.

20 Claims, 4 Drawing Sheets

(51) Int. Cl.
    *H01L 33/62* (2010.01)
    *H01L 33/00* (2010.01)
    *H01L 33/50* (2010.01)
    *H01L 33/58* (2010.01)

(52) U.S. Cl.
    CPC ............ *H01L 33/502* (2013.01); *H01L 33/62* (2013.01); *H01L 33/0095* (2013.01); *H01L 33/50* (2013.01); *H01L 33/58* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 2013/0032842 A1* | 2/2013 | Park | H01L 25/075 257/98 |
| 2013/0187178 A1* | 7/2013 | Tischler | H01L 33/50 257/88 |

FOREIGN PATENT DOCUMENTS

| | | |
|---|---|---|
| EP | 0747948 A2 | 12/1996 |
| EP | 1408559 A2 | 4/2004 |
| WO | 0217405 A1 | 2/2002 |
| WO | 2007147278 A2 | 12/2007 |
| WO | 2013056927 A1 | 4/2013 |

* cited by examiner

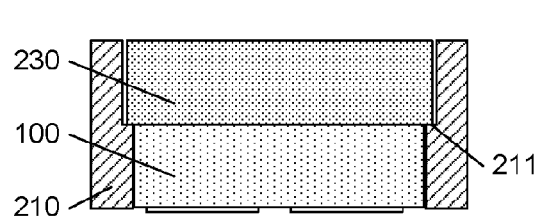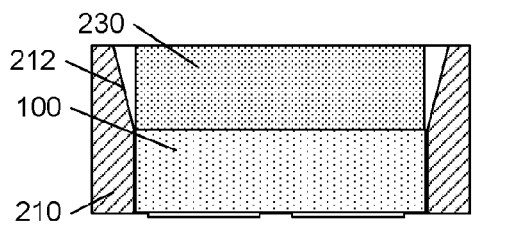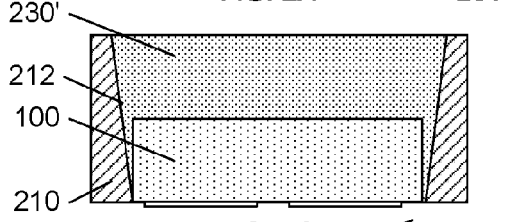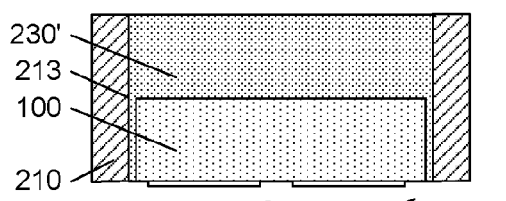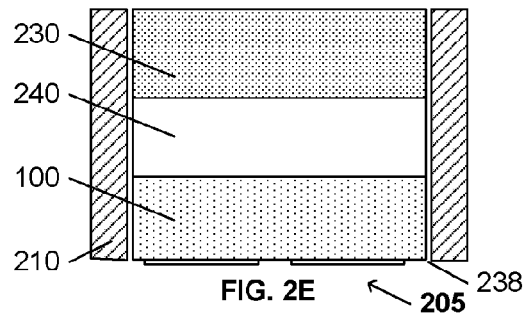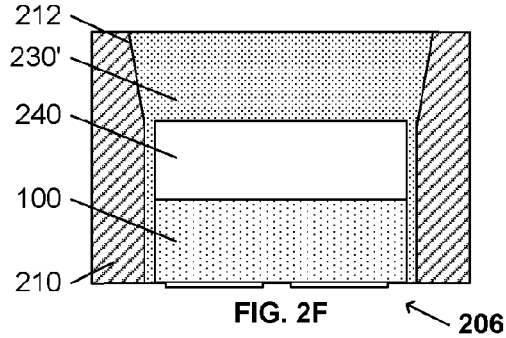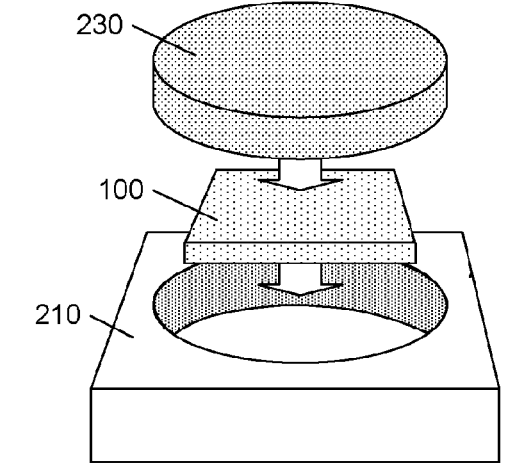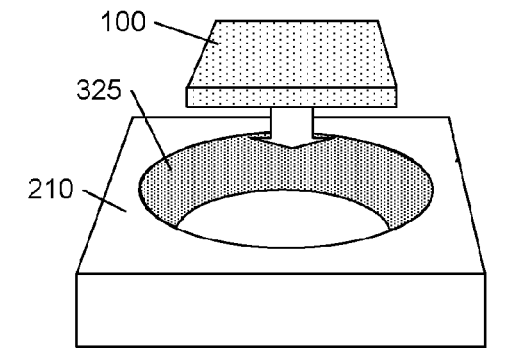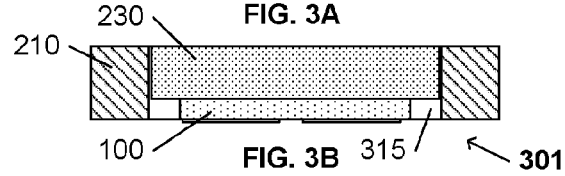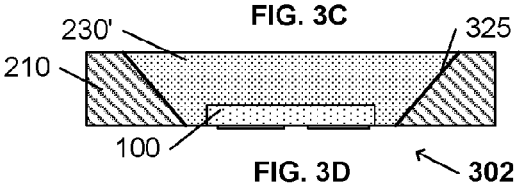

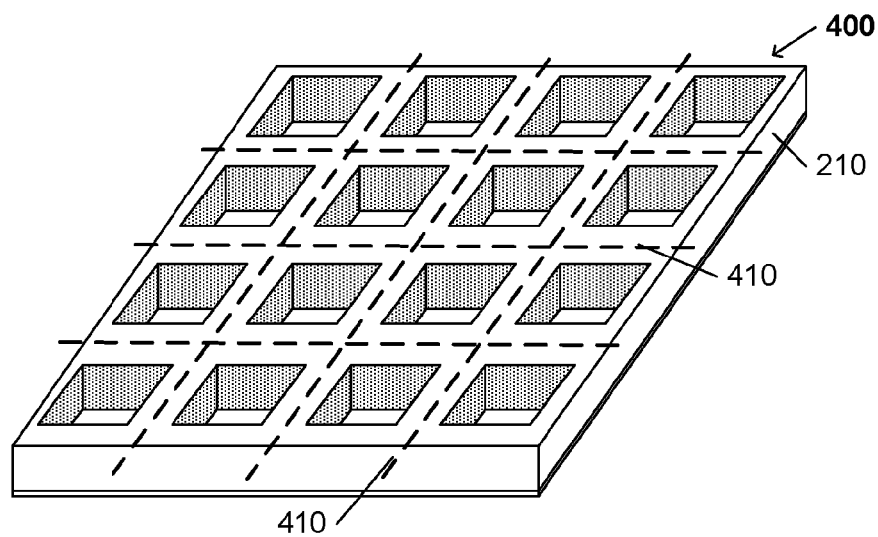
FIG. 4
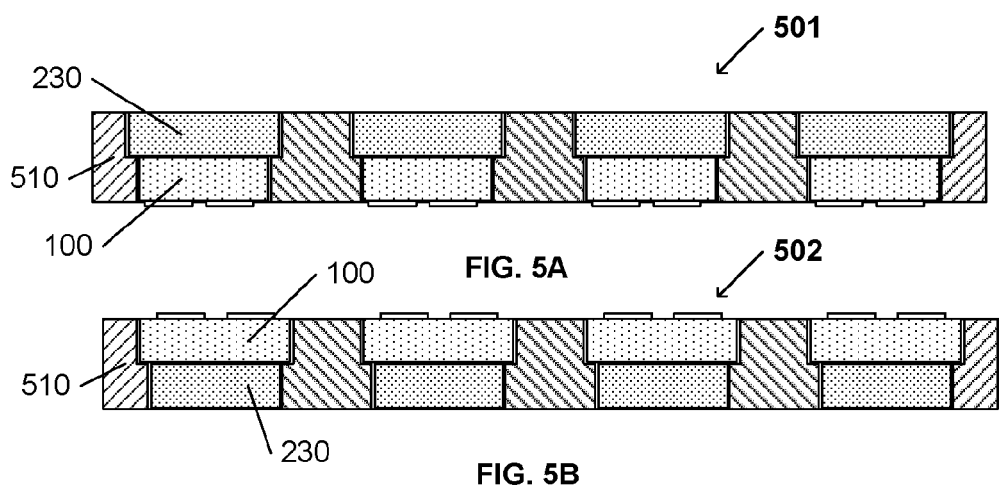
FIG. 5A
FIG. 5B
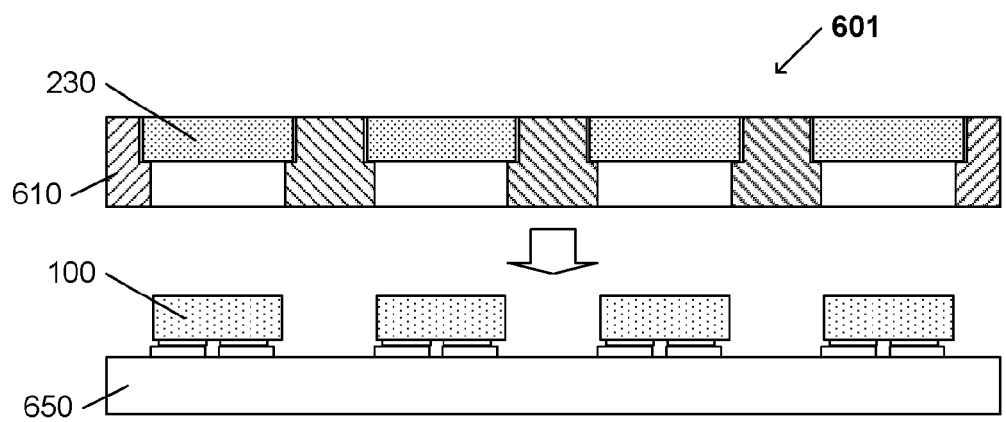
FIG. 6

FRAME BASED PACKAGE FOR FLIP-CHIP LED

CROSS-REFERENCE TO RELATED APPLICATIONS

The present application is a §371 application of International Application No. PCT/IB2014/064106 filed on Aug. 28, 2014 and entitled "FRAME BASED PACKAGE FOR FLIP-CHIP LED," which claims the benefit of U.S. Provisional Application Ser. Nos. 61/877,434, filed Sep. 13, 2013 and 61/936,360, filed Feb. 6, 2014. PCT/IB2014/064106, U.S. 61/877,434, and U.S. 61/936,360 are incorporated herein.

FIELD OF THE INVENTION

This invention relates to the field of light emitting devices, and in particular to a frame that provides a reflective enclosure about the periphery of the device.

BACKGROUND OF THE INVENTION

The ever expanding use of semiconductor light emitting devices has produced a highly competitive market for these devices. In this market, performance and price are often significant for providing product distinction among vendors. Accordingly, a common objective is to reduce the cost of production while providing equivalent or better performance from the light emitting device.

One technique for providing relatively inexpensive packaging of a light emitting element is to place the light emitting element in a frame with leadframe contacts that facilitate external connections to the light emitting element. An LED leadframe generally comprises a pair of conductors that are shaped to provide for external connections to the LED. A support frame may be molded about the leadframe such that the leadframe conductors provide conductive surfaces within the support frame to mount the LED, and conductive surfaces at the exterior of the support frame to mount the framed LED on a printed circuit board or other fixture.

USPA 2010/0207140, "COMPACT MOLDED LED MODULE", published 19 Aug. 2010 for Serge L. Rudaz, Serge Bierhuizen, and Ashim S. Hague, and incorporated by reference herein, discloses an array of support frames within which light emitting devices are bonded to leadframe contacts within each support frame, as illustrated in FIGS. 7A-7B.

FIG. 7A illustrates two leadframes 16 within a molded frame array 40. Each leadframe 16 includes conductors 12 and 14. In this example a tub 10 is formed about each leadframe 16, and the conductors 12 and 14 of leadframe 16 are shaped to extend through the frame element 40 so as to provide contacts 12a, 14a within the tub 10 for mounting a light emitting device, and contacts 12b, 14b for subsequent mounting of the tub 10 with light emitting device onto a printed circuit board or other fixture. Although only two leadframes 16 and tubs 10 are illustrated, a molded frame array 40 may include hundreds of leadframes 16 and tubs 10.

FIG. 7B illustrates two light emitting modules 38. In this example embodiment, a light emitting device 20, which may be a thin-film device with minimal inherent structural support, is situated on a submount 30, which provides the necessary structural support to the light emitting device 20. Other devices, such as an ESD protection device 26 may also be situated on the submount 30. A protective coating 28 may be provided upon the submount 30. Conductors 24 through the submount 30 couple the light emitting device 20 to the contacts 12 and 14 in the leadframe 16.

The tub 10 may be subsequently filled with an encapsulant. Optionally, the encapsulant, or the protective coating 28, or the light emitting device 20, may include a wavelength conversion material, such as phosphor, that absorbs some or all of the emitted light and emits light at a different wavelength. The interior walls 15 of the tub 10 may be reflective, to redirect light toward the outside of the tub 10.

Upon completion, the individual light emitting modules 38 formed by the frame array 40 are singulated by slicing along the line 36. The individualized light emitting modules 38 include side surfaces 35 that facilitate the picking and placing of the light emitting module 38, but consume significantly more volume than the light-producing element 20, and introduces a substantially larger footprint compared to the surface area of the light-producing element 20. This substantial volume and footprint 'overhead' limits the use of such a light emitting module in applications such as flash or illumination elements for portable devices, such as smart phones and the like.

SUMMARY OF THE INVENTION

It would be advantageous to provide a less complex process for providing a light emitting module with side surfaces that facilitate handling of the light emitting module and contacts opposite the light emitting surface. It would also be advantageous to provide such a light emitting module with minimal volume and footprint overhead.

To better address one or more of these concerns, in an embodiment of this invention, a hollow frame is configured to surround the periphery of a substantially self-supporting flip-chip light emitting device. The frame may be shaped to also contain a wavelength conversion element above the light emitting surface of the light emitting device. The lower surface of the light emitting device, which is exposed through the hollow frame, includes contact pads coupled to the light emitting element for surface mounting the light emitting module on a printed circuit board or other fixture. The flip-chip light emitting device may include a patterned sapphire substrate (PSS) upon which the light emitting element is grown, the patterned surface providing enhanced light extraction from the light emitting element, through the patterned sapphire growth substrate.

BRIEF DESCRIPTION OF THE DRAWINGS

The invention is explained in further detail, and by way of example, with reference to the accompanying drawings wherein:

FIGS. 2A-2F illustrate other example interior profiles for the hollow frame.

FIGS. 3A-3D illustrate examples of other hollow frame structures.

FIG. 4 illustrates an example hollow frame array structure.

FIGS. 5A-5B illustrate an example light emitting module that includes a plurality of light emitting diodes within open cavities in a frame element.

FIG. 6 illustrates an example alternative assembly method.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 8A:
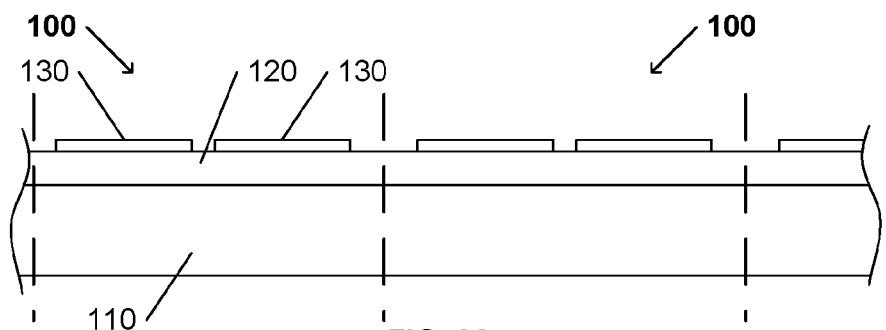
FIGS. 8A-8C illustrate an example self-supporting light emitting die.
Figure 8B:
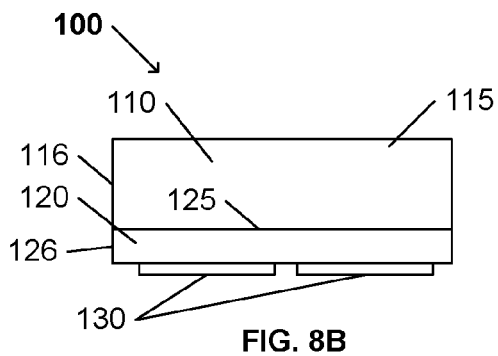
Figure 8C:
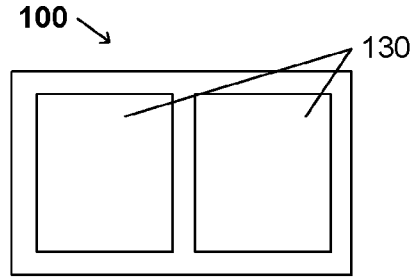

Thick, self-supporting light emitting devices are now commonly available. FIGS. 8A-8C illustrate an example of several self-supporting light emitting devices 100. FIG. 8A illustrates a substrate 110, upon which semiconductor layers are formed/grown to create multiple light emitting devices 100. The substrate 110 is commonly sapphire or glass, and the light emitting element 120 of each device 100 commonly includes an active region sandwiched between an n-type semiconductor layer and a p-type semiconductor layer. Pads 130 provide contact to the n and p layers, such that when current flows between these layers, light is emitted from the active region. Gallium nitride (GaN), doped to provide the n-type and p-type semiconductors, is commonly used as the semiconductor forming the light emitting element 120.

The substrate 110 may be sliced/diced (dashed lines in FIG. 8A) to provide singular light emitting chips 100. In operation, the individual light emitting chips are typically oriented in a 'flip-chip' configuration as illustrated in FIG. 8B, with the contact pads 130 on the nominal 'bottom' of the chip 100, as illustrated in FIG. 8C. Light is emitted primarily from the 'top' surface 125 of the light emitting element 120, into the substrate 110, and subsequently emitted from the top 115 and side 116 surfaces of the substrate 110. Some light may also be emitted from the side surface 126 of the light emitting element 120.

To increase the light extraction efficiency from the light emitting element 120 into the substrate 110, the interface between the substrate 110 and light emitting element 120 may be 'roughened' to reduce the likelihood of total internal reflection (TIR) at the interface. Commonly, the substrate 110 is a Patterned Sapphire Substrate (PSS) upon which the light emitting element 120 is grown, the pattern on the sapphire substrate creating the aforementioned 'roughened' interface between the substrate 110 and the light emitting element 120.

Figure 7A:
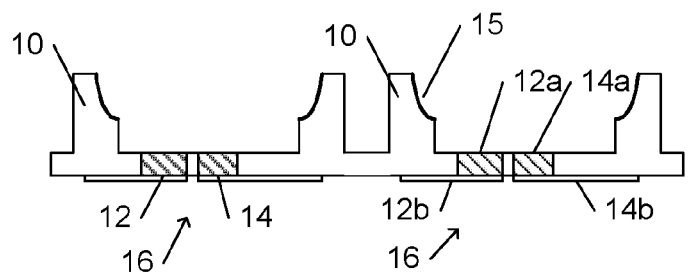
FIGS. 7A-7B illustrate an example prior art light emitting module comprising a support frame with leadframe contacts.
Figure 7B:
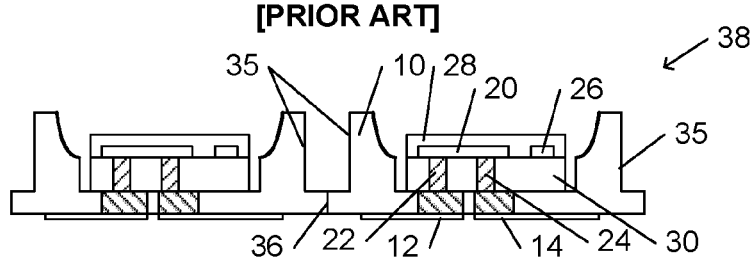

Although the light emitting device 100 is substantially self-supporting, it generally may be 'packaged' to withstand subsequent handling as it undergoes the various processes during assembly of the final product, such as the assembly of a printed circuit board and other fixtures. As in the example of FIGS. 7A-7B, the chips 100 may be placed on a strip or array of leadframes, with the pads 130 soldered to conductors in the leadframe that enable external connection to each of the light emitting chip 100. The array of leadframes is processed to encapsulate each of the light emitting chips, or sets of light emitting chips, then singulated to provide individual encapsulated ('packaged') light emitting devices.

The encapsulation serves multiple purposes; the encapsulant protects the light emitting chip from the environment, and may be formed to provide one or more particular optical functions. For example, the encapsulant may include wavelength conversion material, such as phosphor, that converts some or all of the light emitted from the light emitting chip 100 into light of a different wavelength. The encapsulant may also be shaped to form a lens that provides a desired light output pattern. Optionally, the encapsulant may be placed within a well formed by reflective walls, such as the tub 10 of the light emitting module 38 in FIG. 7B.

FIGS. 1A-1F illustrate a packaging process that eliminates the need for a leadframe and provides for minimal volume and footprint overhead.

Figure 1A:
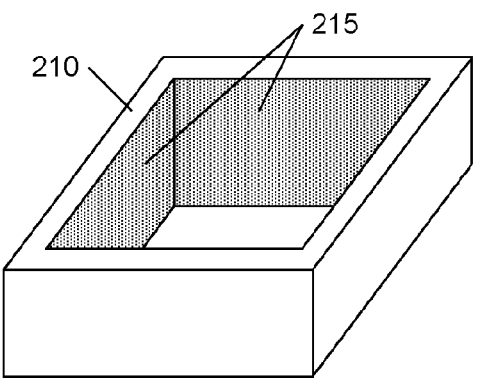
FIGS. 1A-1F illustrate an example light emitting module that includes a hollow frame that surrounds the periphery of a light emitting device with optional wavelength conversion element.
Figure 1B:
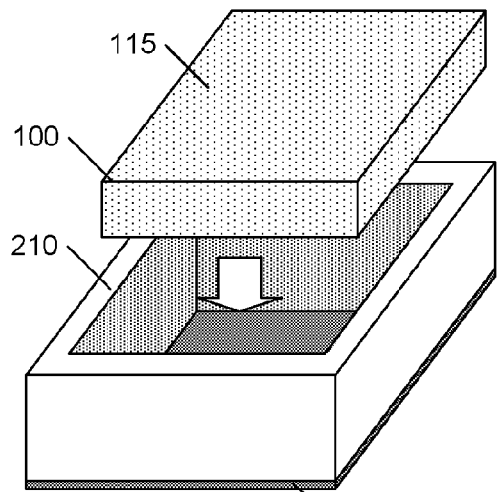

FIG. 1A illustrates an example hollow frame 210, within which a light emitting chip may be placed. Optionally, the interior walls 215 of the frame 210 may be reflective, using, for example, a coating of silver (Ag) or other reflective material. The shape and size of the opening in the frame 210 may correspond to the shape and size of the light emitting chip 100, as illustrated in FIG. 1B. Preferably, the light emitting chip 100 is pre-tested, so that only operational chips 100 are packaged.

Although FIGS. 1A-1F illustrate a single frame 210, an array 400 of frames 210, such as illustrated in FIG. 4, may be provided to enable simultaneous assembly and testing of multiple frames 210.

Before assembly, the array 400 may be processed to apply a reflective material upon the walls 215 within each frame 210. Depending on the intended application for the packaged device, the entire array 400 may be spray coated with a reflective material, or the upper surface of the frames 210 may be masked while the reflective material is applied to the interior walls. Other techniques may be used to apply the reflective coating, including dipping the array 400 in a vat of reflective material. In some embodiments, the material of the frame 210 may be inherently reflective, eliminating the need to apply a separate reflective coating.

After assembly, the array of frames is sliced/diced along cutting lines 410 to provide singulated packaged light emitting devices 200, as illustrated in FIGS. 1A-1F. Although not illustrated, the array 400 may include features between the frames 210 that facilitate such slicing/dicing. Preferably, the material selected for the array 400 is easily sliced using mechanical or laser cutting processes. One of skill in the art will recognize that the frame may be sliced to provide modules that include multiple light emitting chips, as detailed further below with respect to FIGS. 5A-5B.

Figure 1C:
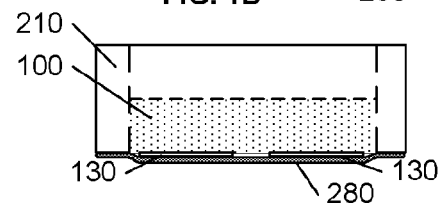

As shown in FIG. 1B, a removable sheet 280, such as an adhesive strip, may cover the lower surface of the frame 210, to provide a surface upon which the chip 100 may be supported during the assembly process. As illustrated in FIG. 1C, the sheet 280 may be flexible, allowing the chip 100 to be placed within the frame 210 such that the contact pads 130 extend slightly below the frame 210, if desired. Optionally, the pads 130 may be flush with the lower surface of the frame 210.

The chip 100 may be secured within the frame 210 using any of a variety of techniques. If the frame 210 is pliable, the opening in the frame may be sized to provide a friction fit. Alternatively, the opening in the frame may be slightly larger than the chip 100, and the walls 215 on the frame 210 or the sidewalls of the chip 100 may be coated with an adhesive before the chip 100 is inserted into the frame 210. If the adhesive is reflective, the need to provide a reflective surface on the walls 215 may be eliminated.

In some embodiments, the frame 210 may be a shrinkable material, such as a heat-shrink material that is shrunk after the light emitting chip 100 (and optional cap 230, discussed below) is inserted into the frame 210. In some embodiments, laser slicing of the frame 400 (in FIG. 4) into individual packaged devices 200 may provide the energy to cause the material to shrink. Other techniques for securing the chip 100 into the frame 210 will be evident to one of skill in the art in view of this disclosure.

Figure 1D:
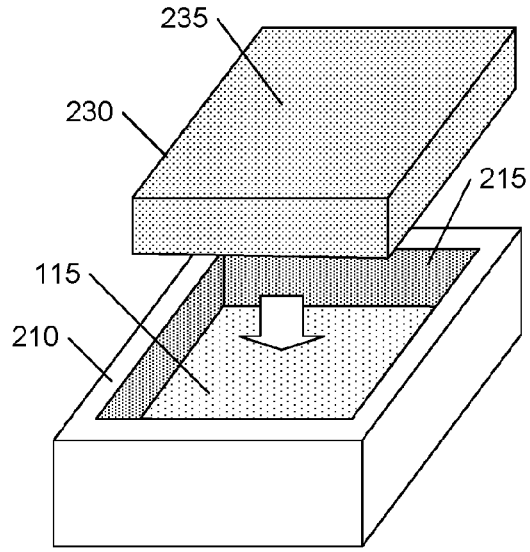

As shown in FIG. 1D, a cap 230 may be provided to cover the light emitting chip 100. This cap receives the light from the light emitting surface 115 of the chip, and may provide for a desired optical effect before the light is emitted from the surface 235 of the cap 230. For example, the cap may include wavelength conversion material that converts some or all of the light from the light emitting chip 100 into light of one or more different wavelength to achieve a desired color point. Similarly, although illustrated as a parallelepiped, the cap 230 may be shaped to form a lens that provides a desired light output pattern, such as a collimating lens.

The light emitting surface 115 of the light emitting chip 100, and the light emitting surface 235 of the cap 230 may be roughened or patterned to enhance the light emission efficiency by reducing the likelihood of total internal reflection (TIR) at these surfaces. Optionally, an interface material may be applied at the interface between the light emitting chip 100 and the cap 230, or between these elements and the reflective walls 215 to enhance the optical coupling between these elements.

Figure 1E:
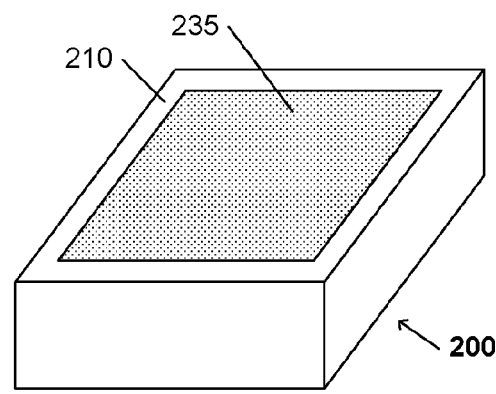

As shown in FIG. 1E, frame 210 may be sized to contain the cap 230 as well as the chip 100, and the reflective walls 215 serve to redirect light that may escape from the sides of the cap 230. The placement of the cap 230 in the frame 210 provides for a fine alignment of the cap 230 and the light emitting chip 100, which is often required to achieve a particular light output pattern that is consistent among the packaged devices 200. The cap 230 may be attached to the frame 210 using any of the attachment methods used for attaching the chip 100 to the frame 210.

After attaching the chip 100 and optional cap 230 to the frame 210, the packaged device 200 will have a light emitting surface 235 (or surface 115 if the optional cap 230 is not included) as the 'upper' surface, and contact pads 130 on the 'lower' surface of the device 200. In this manner, a packaged light emitting device 200 is formed without the use of a leadframe or a submount.

Figure 1F:
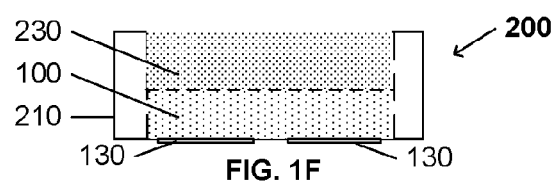

As shown in FIG. 1E and FIG. 1F, the packaged light emitting device 200 has a minimal amount of volume and footprint overhead, as well as a low profile, and is particularly well suited for use in small, handheld devices, such as phones and the like. The reduced volume and footprint overhead may also be beneficial for other applications, such as automotive, illumination, and display applications.

One of skill in the art will recognize that the frame 210 may include other features that facilitate the assembly process. For example, the opening in the frame 210 may include features that allow air bubbles to escape the frame 210 when the chip 100 and cap 230 are inserted, common in the art. In like manner, the frame 210 may include a material such as $TiO_2$ or silicone between the cap 230 and the reflective walls 215 to reduce or eliminate "blue ring", which may be caused when blue light exits the edges of the light emitting chip 100, without passing through a cap that includes wavelength converting material.

One of skill in the art will also recognize that the frame 210 may provide other functions in addition to protecting the light emitting chip 100 and providing a package with minimal volume and footprint overhead. For example, the material for frame 210 may be selected to provide high thermal conductivity, thereby extending the life of the device 200 by efficiently dissipating the heat generated by the light emitting chip 100, and the cap 230 if it includes a wavelength conversion material.

Although the invention is presented above using an example process wherein the light emitting chip 100 is inserted first, then the cap 230, one of skill in the art will recognize that the cap 230 may be inserted into the frame 210 first, followed by the light emitting chip; or, the cap 230 and light emitting chip 100 may be attached to each other, then inserted into the frame 210.

FIGS. 2A-2F illustrate other example interior profiles for hollow frames 201-206.

As shown in FIG. 2A, example frame 201 includes a 'step' feature 211 that serves to control the vertical arrangement of the light emitting chip 100 and the cap 230. In particular, the step 211 may be situated to control the extent to which the contacts of the light emitting chip 100 extend beyond the lower surface of the frame 201 when the cap 230 is inserted.

As shown in FIG. 2B, frame 202 includes a sloped wall segment 212 that facilitates the insertion of the light emitting chip 100 into the frame 210, and also serves to re-direct any side emitted light from the cap 230 away from the light emitting chip 100.

As shown in FIG. 2C, frame 203 the sloped wall segment 212 extends to the lower surface of the frame 210. Also illustrated in FIG. 2C, the cap 230' is created by dispensing a material in liquid or paste form into the cavity formed by the opening in the frame 210, then solidifying the material. For example, the material may be silicone with optional wavelength conversion material that is applied in liquid form then cured to form a rigid cap 230'. In such an embodiment, the liquid or paste material may serve as the adhesive that attaches the chip 100 to the frame 210.

As shown in FIG. 2D, frame 204 also includes a cap 230' that is dispensed into the cavity, but in this example, the walls 213 are not sloped.

As shown in FIG. 2E, frame 205 includes an intermediate optical element 240 situated between the chip 100 and the cap 230. This optical element 240 may provide a particular optical effect, or it may enhance the light extraction efficiency by providing an index of refraction that is between the indices of refraction of the chip 100 and the cap 230. This optical element 240 is illustrated as a pre-formed parallelepiped, but it may be of any shape, and may be dispensed in liquid or paste form then solidified (not illustrated). As in the example of a cap 230' that is dispensed within the cavity of the frame 210, the dispensed optical element 240 may serve to attach the chip 100 to the frame 210. There may be a small gap 238 between the elements 230, 240, 100 and the frame 210 or one or more of the elements 230, 240, 100 may fit tightly inside frame 210.

One of skill in the art will recognize that a variety of forming and assembling techniques may be used to achieve a desired packaging construct. Some or all of the techniques shown in FIGS. 2A-2E may be combined. As shown in FIG. 2F, example frame 206, includes sloped wall segments 212, a pre-formed intermediate optical element 240, and a cap 230' that is dispensed in liquid or paste form and serves to attach the chip 100 and optical element 240 to the frame 210.

Although the opening in the frame 210 is preferably shaped to correspond to the shape of the light emitting chip, which is typically rectilinear, to minimize the footprint of the resultant device 200 (or 201-206), other shaped openings may be provided. For example, because it is generally simpler to drill or bore circular holes through a material, cylindric or conic holes may be provided as illustrated in FIGS. 3A-3D.

As shown in FIG. 3A and in cross section in FIG. 3B, example device 301 includes frame 210 and a cylindrical hole in which a rectilinear light emitting chip 100 and a circular cap 230 are placed. In this example embodiment, the size of the hole is such that it circumscribes the light emitting chip 100 i.e. the diagonal of the light emitting chip 100 is less than or equal to the diameter of the cylindrical hole. In this manner, the extra footprint overhead caused by a cylindrical hole instead of a rectilinear hole is minimized. In some embodiments, the light emitting chip 100 is pre-attached to the circular cap 230, then the pair of elements 100, 230 are placed within the cylindrical frame 210. The space between the chip 100 and the cylindrical walls 315 of the frame 210 may be filled with a reflective material, such as a dielectric paste that is subsequently hardened.

As shown in FIG. 3C and in cross section in FIG. 3D, example device 302, the frame 210 includes a conic hole, with the size of the opening at the bottom surface of the frame 210 circumscribing the chip 100. In this example, the cap 230' is dispensed within the conic cavity in liquid or paste form, then hardened, and may serve to attach the chip 100 to the frame 210. Optionally, the walls 325 may be reflective.

As noted above, the frame 400 of FIG. 4 may be configured and sliced/diced such that each singulated module includes a plurality of light emitting chips. Multiple chip modules are commonly used for high power applications, such as automotive lighting modules.

FIGS. 5A-5B illustrates example light emitting modules that includes a plurality of light emitting diodes within the light emitting module. In these examples, the light emitting modules 501, 502 comprise one or more rows of four light emitting chips 100 with caps 230. That is, the modules 501, 502 may be a 'linear' light strip comprising four chips 100, or an 'M×N' array of chips 100. The variables M or N may be 4 or any other suitable integer.

In the example automotive lighting applications, the placement of the chips 100 within defined cavities in the frame provides for a simple method of achieving the high alignment precision that may be required for certain automotive lamps.

FIG. 5A illustrates a frame 510 in which each light emitting chip 100 is inserted first, followed by a corresponding cap 230.

FIG. 5B illustrates the same frame 510 in which the cap 230 is inserted first, followed by the 'face-down' insertion of the light emitting chip 100. This method provides an advantage in that the caps 230 provide a level surface with the frame 510, as contrast to the protruding contacts of the light emitting chip 100. This may simplify the assembly process, and provide a wider range of options with regard to the choice of materials used as the removable sheet (280 in FIG. 1B) that provides a surface upon which the first inserted element is supported during the assembly process. That is, the requirement that the sheet 280 be stretchable to accommodate the contacts 130, as illustrated in FIG. 1C, is eliminated.

FIG. 6 illustrates an example alternative assembly method. In this example, the caps 230 are placed in a frame 610, and the light emitting chips 100 are attached to a substrate 650, such as a printed circuit board. After attaching the light emitting chips 100 to the substrate 650, the frame 610 with caps 230 is placed upon the substrate.

Although FIG. 6 illustrates a multi-chip module 601, one of skill in the art will recognize that single chip modules may be assembled in the same way.

While the invention has been illustrated and described in detail in the drawings and foregoing description, such illustration and description are to be considered illustrative or exemplary and not restrictive; the invention is not limited to the disclosed embodiments.

For example, although the figures illustrate a frame 210 that encloses all of the elements 100, 230, 240 it is possible to operate the invention in an embodiment wherein some or all of the cap 230 extends above the frame 210 and is shaped to provide a particular optical effect. For example, the cap 230 may be mushroom-shaped, the upper portion providing a wider distribution of the emitted light. In like manner, some or all of the optical element 240 may extend above the frame 210, and the cap 230 may encapsulate the portion of the optical element 240 extending beyond the frame 210. The cap 230 may also be omitted and the optical element 240 may be shaped to provide the aforementioned desired optical effect.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting device, comprising:
    a frame defining a through hole;
    a light emitting chip secured within the through hole, the light emitting chip comprising one or more sides in direct contact with one or more walls of the through hole, wherein the light emitting chip comprises:
        a substrate;
        a light emitting element on the substrate, wherein the light emitting element comprises an active region that is sandwiched between an n-type semiconductor and a p-type semiconductor; and
        contact pads on a surface of the light emitting element that is opposite the substrate, wherein at least a first contact pad is connected to the n-type semiconductor and a second contact pad is connected to the p-type semiconductor; and
    a cap secured within the through hole.

2. The device of claim 1, wherein the substrate is a growth substrate upon which the light emitting element is formed.

3. The device of claim 1, wherein the substrate comprises a patterned sapphire substrate.

4. The device of claim 1, wherein the cap receives the light from the substrate, and emits light from a light emitting surface of the cap.

5. The device of claim 4, wherein the cap includes a wavelength conversion material that absorbs some or all of the light from the light emitting element and converts it to light of a different wavelength.

6. The device of claim 4, wherein the frame includes reflective inner walls adjacent the substrate and the cap.

7. The device of claim 1, wherein the frame surrounds a plurality of light emitting elements.

8. The device of claim 1, wherein the through hole is sized to provide a friction fit to the light emitting chip or the frame comprises a heat shrink material shrunken to secure the light emitting chip.

9. The device of claim 8, wherein:
the cap is a pre-formed element; and
the through hole includes a step feature that introduces a restriction in the through hole that controls a location of the cap or the light emitting chip within the through hole.

10. The device of claim 1, further comprising an intermediate optical element between the light emitting chip and the cap.

11. A frame structure, comprising:
a frame including a plurality of through holes;
a plurality of light emitting chips situated in the through holes, each of the light emitting chips comprising one or more sides in direct contact with one or more walls of a corresponding through hole, each of the light emitting chips including:
a substrate;
a light emitting element being situated on the substrate and emitting light through the substrate; and
contact pads that are formed on a surface of the light emitting element that is opposite the substrate; and
a plurality of caps secured within the through holes;
wherein each of the through holes allows external contact directly to the contact pads and allows light from the substrate to exit the frame structure.

12. The frame structure of claim 11, wherein each cap is optically coupled to the substrate of the light emitting chip within a corresponding through hole.

13. The frame structure of claim 12, wherein each cap includes a wavelength conversion material.

14. The frame structure of claim 11, wherein each through hole is sized to provide a friction fit to a corresponding light emitting chip or the frame comprises a heat shrink material shrunken to secure the light emitting chips.

15. The frame structure of claim 14, wherein:
each cap is a pre-formed element; and
each through hole includes a step feature that introduces a restriction in the through hole that controls a location of a corresponding cap or light emitting chip within the through hole.

16. A method of forming light emitting modules, comprising:
providing a frame structure that includes a plurality of through holes;
placing a light emitting chip within each of the through holes, each of the light emitting chips comprising one or more sides in direct contact with one or more walls of a corresponding through hole, wherein each of the light emitting chips includes:
a substrate;
a light emitting element situated on the substrate and emitting light through the substrate; and
contact pads that are formed on a surface of the light emitting element that is opposite the substrate;
placing a cap within each of the through holes; and
slicing the frame structure to provide individual light emitting modules each including one or more light emitting chips, wherein each through hole allows external contact directly to the contact pads and allows light from the substrate to exit a corresponding light emitting module.

17. The method of claim 16, wherein the substrate is a growth substrate upon which each of the light emitting elements is formed.

18. The method of claim 16, wherein each cap includes a wavelength conversion material.

19. The method of claim 16, wherein said providing the frame structure comprises sizing each through hole to provide a friction fit to a corresponding light emitting chip.

20. The method of claim 16, further comprising shrinking the frame to secure the light emitting chips within the through holes.

* * * * *